(12) United States Patent
Yang

(10) Patent No.: US 11,795,811 B2
(45) Date of Patent: Oct. 24, 2023

(54) METHOD AND SYSTEM TO IMPROVE OPEN LOOP SYSTEMS

(71) Applicant: Halliburton Energy Services, Inc., Houston, TX (US)

(72) Inventor: Jie Yang, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 749 days.

(21) Appl. No.: 16/069,989

(22) PCT Filed: Aug. 15, 2017

(86) PCT No.: PCT/US2017/046944
§ 371 (c)(1),
(2) Date: Apr. 7, 2021

(87) PCT Pub. No.: WO2019/035814
PCT Pub. Date: Feb. 21, 2019

(65) Prior Publication Data
US 2022/0082011 A1 Mar. 17, 2022

(51) Int. Cl.
*E21B 47/085* (2012.01)
*G01N 24/08* (2006.01)
*G01R 33/36* (2006.01)

(52) U.S. Cl.
CPC ......... *E21B 47/085* (2020.05); *G01N 24/081* (2013.01); *G01R 33/3628* (2013.01)

(58) Field of Classification Search
CPC .............. E21B 47/085; G01N 24/081; G01R 33/3628; G01R 33/583; G01V 3/32
See application file for complete search history.

(56) References Cited

U.S. PATENT DOCUMENTS

| 5,229,699 A | 7/1993 | Chu et al. |
| 5,386,477 A | 1/1995 | Popovich et al. |

(Continued)

FOREIGN PATENT DOCUMENTS

| WO | 2012125935 A2 | 9/2012 |
| WO | 2016108851 A1 | 7/2016 |

OTHER PUBLICATIONS

International Search Report and the Written Opinion for International Application No. PCT/US2017/046944 dated Mar. 29, 2018, 19 pages.

*Primary Examiner* — G. M. A Hyder
(74) *Attorney, Agent, or Firm* — K&L Gates LLP

(57) ABSTRACT

A method and system for transmitting an electromagnetic (EM) signal in a wellbore to improve an open loop system. The method comprises measuring a parameter indicative of a property of a transmitter using a sensor in the wellbore and generating an input signal for the transmitter based at least in part on the measured parameter to correct distortions exhibited by the output signal of the transmitter. The method comprises also comprises applying the input signal to the transmitter to transmit the EM signal corrected for distortions. The system comprises an antenna, a transmitter, a sensor, and a controller. The controller is configured and operable to generate an input signal for the transmitter based at least in part on the measured parameter to correct distortions exhibited by an output signal of the transmitter; and apply the input signal to the transmitter to transmit the EM signal corrected for the distortions.

20 Claims, 10 Drawing Sheets

(56) References Cited

U.S. PATENT DOCUMENTS

| | | | |
|---|---|---|---|
| 5,600,729 | A | 2/1997 | Darlington et al. |
| 6,665,410 | B1 | 12/2003 | Parkins |
| 2002/0000316 | A1* | 1/2002 | Haase ................... E21B 47/103 166/372 |
| 2007/0075706 | A1 | 4/2007 | Chen et al. |
| 2013/0093422 | A1 | 4/2013 | Morys et al. |
| 2013/0176140 | A1 | 7/2013 | Tyshko |

* cited by examiner

METHOD AND SYSTEM TO IMPROVE OPEN LOOP SYSTEMS

BACKGROUND

This section is intended to provide relevant background information to facilitate a better understanding of the various aspects of the described embodiments. Accordingly, it should be understood that these statements are to be read in this light and not as admissions of prior art.

Nuclear magnetic resonance (NMR) is used as a tool in a number of different technology areas to investigate different types of mediums. NMR can occur when the medium is subjected to a static magnetic field, B0, and to an oscillating magnetic field, B1. When subjected to an applied static magnetic field, polarization of nuclear magnetic spins of the medium occurs based on spin number of the medium and magnetic field strength. Applying an electromagnetic field to the medium in the static magnetic field can perturb the polarization established by the static magnetic field. In optimal measurements, the static magnetic field and the perturbing field are perpendicular to each other. Collected responses received from the medium related to the total magnetization of nuclear spins in the medium, in response to these applied fields, can be used to investigate properties of the medium, and may provide imaging of the medium. It is noted that magnetization is proportional to polarization.

Nuclear magnetic resonance measurements are created by the oscillation of excited nuclear magnetic spins in the transverse plane, that is, the direction perpendicular to the magnetic field. This oscillation eventually dies out and the equilibrium magnetization returns. The return process is referred to as longitudinal relaxation. The time constant, T1, for nuclei to return to their equilibrium magnetization, M0, is called the longitudinal relaxation time or the spin lattice relaxation time. The magnetization dephasing, that is losing coherence, along the transverse plane is given by the time constant T2 and is called the spin-spin relaxation time. The loss of phase coherence can be caused by several factors including interactions between spins or magnetic gradients.

A widely used NMR measurement technique, designed by Carr, Purcell, Meiboom, and Gill and, hence, referred to as CPMG, uses a sequence of radio frequency (RF) pulses to produce spin echoes and counteract dephasing of the magnetization in the medium investigated. In the CPMG sequence, an initial pulse, commonly a 90° pulse, can be applied to tip the polarization into a plane perpendicular to the static magnetic field. To counter dephasing due to magnetic inhomogeneities, another pulse, a recovery pulse, commonly a 180° or other angle tipping pulse, is applied to return to phase, which produces a signal called an echo from the medium. Yet, after each return to phase, dephasing begins and another recovery pulse is applied for rephasing. Rephasing or refocusing is repeated many times in the CPMG sequence, while measuring each echo. The echo magnitude decreases with time due to a number of irreversible relaxation mechanisms. The CPMG sequence can have any number of echoes, where the time between each echo can be relatively short, for example, of the order of 1 ms or less or as long as 12 ms is used.

Petrophysical information can be derived from NMR measurements, such as, but not limited to petrophysical properties of porous media containing formation fluids. Various properties that can be measured using an NMR logging tool include pore size, porosity, surface-to-volume ratio, formation permeability, and capillary pressure. For instance, the distribution of T2 values can be used to estimate pore size. As noted above, T2 is related to loss of phase coherence that occurs among spins, which can be caused by several factors. For example, magnetic field gradients in pores lead to different decay rates. Thereby different pore sizes in the formation produce a distribution of T2 values, which is shown in the conversion of spin-echo decay data of NMR measurements. This distribution represents a "most likely" distribution of T2 values that produce the echo train of the measurement. This distribution can be correlated with a pore size distribution when the rock is 100% water saturated. However, if hydrocarbons are present, the T2 distribution will be altered depending on the hydrocarbon type, viscosity, and saturation. With proper calibration and account for hydrogen index of the fluids in the pore space, the area under a T2 distribution curve is equal to total porosity. More precision in the evaluation of NMR data may be aided with increased acquisition of data from multiple NMR measurements.

The RF pulses transmitted by the NMR system may apply a certain pulse signal, such as a Hann pulse, to produce the echoes. The RF pulses transmitted by the NMR system can suffer from distortion caused by downhole conditions including the impedance of fluids in the wellbore (such as drilling fluid or wellbore fluid) or the temperature of the transmitter electronics used to transmit the RF pulses. Some NMR systems provide closed-loop feedback of the RF pulses during the RF sequence to mitigate the distortion by monitoring and adjusting the RF pulses to match a selected pulse signal. Closed-loop feedback can offer improved RF pulses for NMR measurements, but there are tradeoffs for implementing closed-loop feedback, such as introducing noise from the feedback into the NMR system, which can further distort the RF pulses, and increasing the complexity of the NMR system to handle the feedback in real-time during the RF sequence. It would be advantageous for an NMR system to be responsive to the downhole conditions without the noise produced by or complexity required for closed-loop solutions.

DESCRIPTION OF THE DRAWINGS

Embodiments of the disclosure are described with reference to the following figures. The same numbers are used throughout the figures to reference like features and components. The features depicted in the figures are not necessarily shown to scale. Certain features of the embodiments may be shown exaggerated in scale or in somewhat schematic form, and some details of elements may not be shown in the interest of clarity and conciseness.

DETAILED DESCRIPTION

Figure 1A:
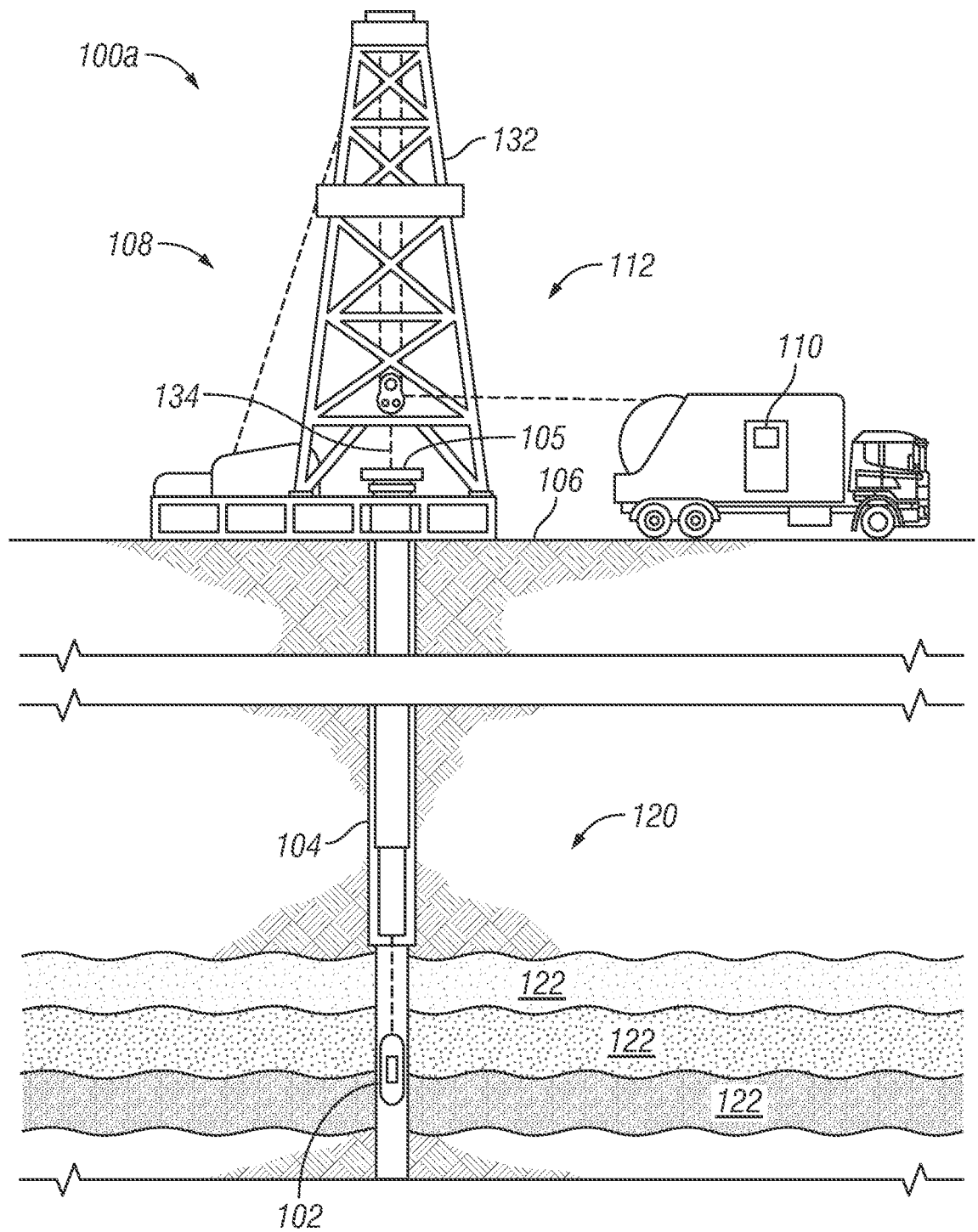
FIGS. 1A and B show diagram views of an example well system, according to one or more embodiments.

FIG. 1A is a diagram view of an example well system 100a that includes an NMR logging system 108 positioned in a subterranean region 120 beneath the ground surface 106, in accordance with one or more embodiments. The subterranean region 120 can include all or part of one or more subterranean formations or zones. The example subterranean region 120 shown in FIG. 1A includes multiple subsurface layers 122 and a wellbore 104 penetrated through the subsurface layers 122. The subsurface layers 122 can include sedimentary layers, rock layers, sand layers, or combinations of these other types of subsurface layers. One or more of the subsurface layers can contain fluids, such as brine, oil, gas, etc. Although the example wellbore 104 shown in FIG. 1A is a vertical wellbore, the NMR logging system 108 can be implemented in other wellbore orientations. For example, the NMR logging system 108 may operate in horizontal wellbores, slant wellbores, curved wellbores, vertical wellbores, or combinations of these.

The example NMR logging system 108 includes a downhole NMR logging tool 102, surface equipment 112, and a computing subsystem 110. In the example shown in FIG. 1A, the NMR logging tool 102 is a downhole logging tool that operates while disposed in the wellbore 104. The example surface equipment 112 shown in FIG. 1A operates at or above the surface 106, for example, near the well head 105, to control the NMR logging tool 102 and possibly other downhole equipment or other components of the well system 100a. The example computing subsystem 110 can receive and analyze logging data from the NMR logging tool 102. An NMR logging system can include additional or different features, and the features of an NMR logging system can be arranged and operated as represented in FIG. 1A or in another manner.

All or part of the computing subsystem 110 can be implemented as a component of, or can be integrated with one or more components of, the surface equipment 112, the NMR logging tool 102 or both. In some cases, the computing subsystem 110 can be implemented as one or more discrete computing systems that are separate from the surface equipment 112 and the NMR logging tool 102.

The computing subsystem 110 may be embedded in the NMR logging tool 102, and the computing subsystem 110 and the NMR logging tool 102 can operate concurrently while disposed in the wellbore 104. For example, although the computing subsystem 110 is shown above the surface 106 in the example shown in FIG. 1A, all or part of the computing subsystem 110 may reside below the surface 106, for example, at or near the location of the NMR logging tool 102.

The well system 100a can include communication or telemetry equipment that allows communication among the computing subsystem 110, the NMR logging tool 102, and other components of the NMR logging system 108. For example, the components of the NMR logging system 108 can each include one or more transceivers or similar apparatus for wired or wireless data communication among the various components. The NMR logging system 108 can include systems and apparatus for wireline telemetry, wired pipe telemetry, mud pulse telemetry, acoustic telemetry, electromagnetic telemetry, or a combination of these and other types of telemetry. In some cases, the NMR logging tool 102 receives commands, status signals, or other types of information from the computing subsystem 110 or another source. In some cases, the computing subsystem 110 receives logging data, status signals, or other types of information from the NMR logging tool 102 or another source.

NMR logging operations can be performed in connection with various types of downhole operations at various stages in the lifetime of a well system. Structural attributes and components of the surface equipment 112 and NMR logging tool 102 can be adapted for various types of NMR logging operations. For example, NMR logging may be performed during drilling operations, during wireline logging operations, or in other contexts. As such, the surface equipment 112 and the NMR logging tool 102 may include, or may operate in connection with drilling equipment, wireline logging equipment, or other equipment for other types of operations.

The surface equipment 112 includes a platform above the surface 106 equipped with a derrick 132 that supports a wireline cable 134 that extends into the wellbore 104. Wireline logging operations can be performed, for example, after a drilling string is removed from the wellbore 104, to allow the wireline NMR logging tool 102 to be lowered by wireline or logging cable into the wellbore 104.

Figure 1B:
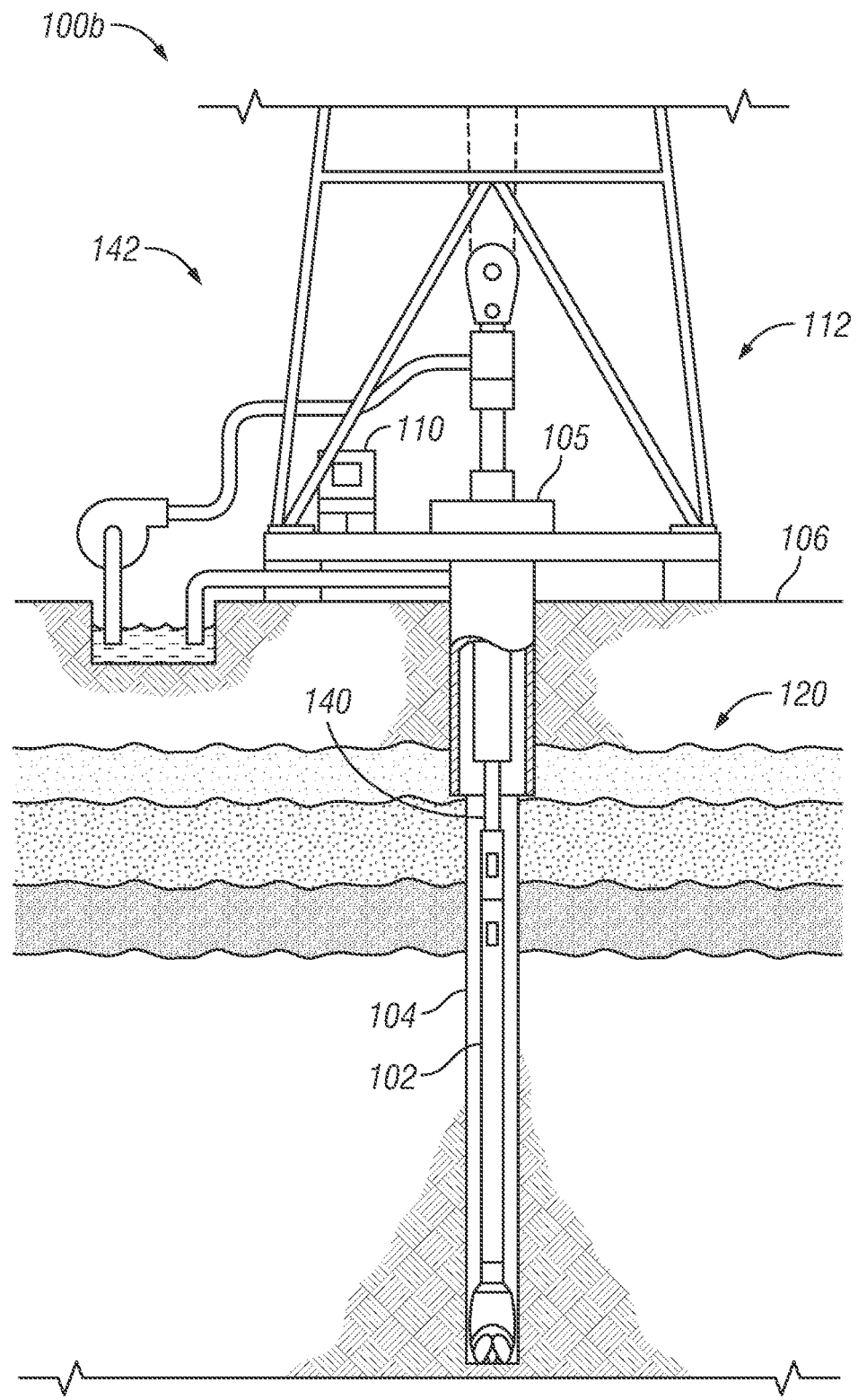

NMR logging can also be performed during drilling operations. FIG. 1B shows an example well system 100b that includes the NMR logging tool 102 in a logging while drilling (LWD) environment, in accordance with one or more embodiments. Drilling is commonly carried out using a string of drill pipes connected together to form a drill string 140 that is lowered through a rotary table into the wellbore 104. In some cases, a drilling rig 142 at the surface 106 supports the drill string 140, as the drill string 140 is operated to drill a wellbore penetrating the subterranean region 120. The drill string 140 may include, for example, a kelly, drill pipe, a bottom hole assembly, and other components. The bottom hole assembly on the drill string may include drill collars, drill bits, the NMR logging tool 102, and other components. The logging tools may include measuring while drilling (MWD) tools, LWD tools, and others.

The NMR logging tool 102 obtains NMR measurements from the subterranean region 120. As shown, for example, in FIG. 1B, the NMR logging tool 102 can be suspended in the wellbore 104 by a coiled tubing, wireline cable, or another structure that connects the tool to a surface control unit or other components of the surface equipment 112. In some example implementations, the NMR logging tool 102 is lowered to the bottom of a region of interest and subsequently pulled upward (e.g., at a substantially constant speed) through the region of interest. As shown, for example, in FIG. 1B, the NMR logging tool 102 can be deployed in the wellbore 104 on jointed drill pipe, hard wired drill pipe, or other deployment hardware. In some example implementations, the NMR logging tool 102 collects data during drilling operations as it moves downward through the region of interest. In some instances, the NMR logging tool 102 collects data while the drilling string 140 is moving, for example, while it is being tripped in or tripped out of the wellbore 104.

The NMR logging tool 102 may collect data at discrete logging points in the wellbore 104. For example, the NMR logging tool 102 can move upward or downward incrementally to each logging point at a series of depths in the wellbore 104. At each logging point, instruments in the NMR logging tool 102 perform measurements on the subterranean region 120. The measurement data can be communicated to the computing subsystem 110 for storage, processing, and analysis. Such data may be gathered and analyzed during drilling operations (e.g., during logging while drilling (LWD) operations), during wireline logging operations, or during other types of activities.

The computing subsystem 110 can receive and analyze the measurement data from the NMR logging tool 102 to detect properties of various subsurface layers 122. For example, the computing subsystem 110 can identify the density, fluid content, or other properties of the subsurface layers 122 based on the NMR measurements acquired by the NMR logging tool 102 in the wellbore 104.

The NMR logging tool 102 obtains NMR signals by polarizing nuclear spins in the subterranean region 120 and pulsing the nuclei with a radio-frequency (RF) magnetic field. Various pulse sequences (i.e., series of RF pulses) can be used to obtain NMR signals, including the Carr Purcell Meiboom Gill (CPMG) sequence (in which the spins are first tipped using a tipping pulse followed by a series of refocusing pulses), the Optimized Refocusing Pulse Sequence (ORPS) in which the tipping pulse is less than 90° and the refocusing pulses are less than 180°, and other pulse sequences. The acquired spin-echo signals may be inverted to a relaxation-time distribution (e.g., a distribution of a transverse relaxation times T2 or a longitudinal relaxation time T1). The relaxation-time distribution can be used to determine various physical properties of the formation by solving one or more inverse problems. Thus, it should be appreciated that the NMR tool 102 may be used, in accordance with one or more embodiments, in various applications, such as wireline, slickline, coiled tubing, measurement-while-drilling, logging-while-drilling, etc.

Figure 2:
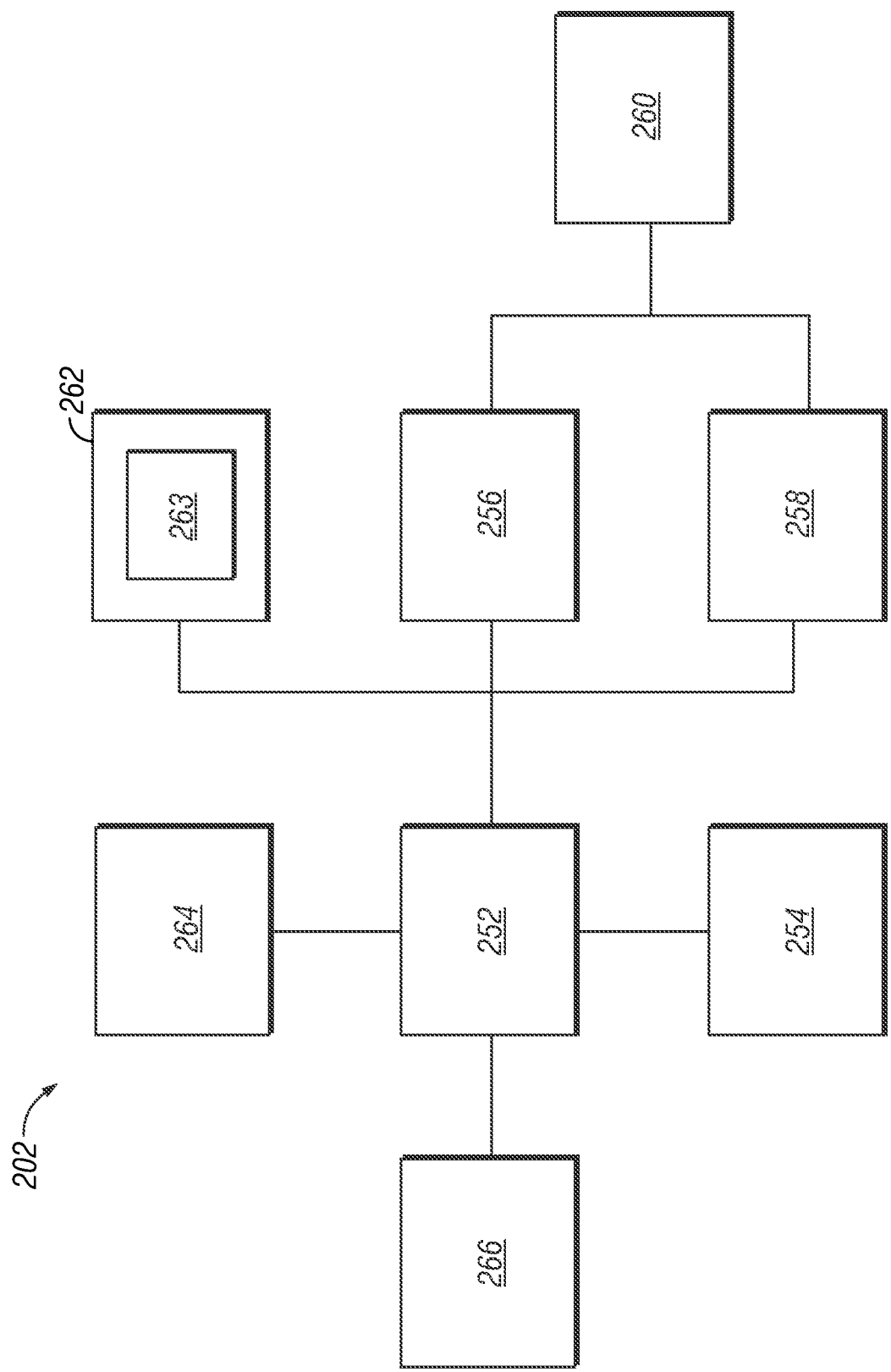
FIG. 2 shows a block diagram view of an NMR logging tool, according to one or more embodiments.

FIG. 2 shows a block diagram view of an NMR logging tool 202, in accordance with one or more embodiments. The NMR logging tool 202 can be operated as the example NMR logging tool 102 depicted in FIGS. 1A and B, or the NMR logging tool 202 may be operated in another manner. As shown, the NMR logging tool includes a controller 252, memory 254, a transmitter 256, a receiver 258, an antenna 260, a principal magnet system 262, a sensor 264, and a communication interface 266. The NMR logging tool 202 may include additional or different features (e.g., a gradient system, etc.). The NMR logging tool 202 may be included in a drill string and operated in a drilling context while disposed in a wellbore in a subterranean earth formation. The NMR logging tool 202 may also be operated in a wireline logging context while supported in a wellbore by a wireline system. The NMR logging tool 202 may be operated in other contexts and for other purposes.

The principal magnet system 262 can include multiple permanent magnets 263 configured to create a static magnetic field about the NMR logging tool 202. The principal magnet system 262 can produce a static magnetic field that is designed to polarize nuclear spins in a volume of a subterranean formation about the wellbore. The static magnetic field generated by the principal magnet system 262 may be substantially uniform over a region of interest, but in some instances, the static magnetic field need not be uniform.

The transmitter 256 can generate and send an electromagnetic (EM) drive signal to the antenna 260. The transmitter 256 can receive input data (e.g., an input signal) from the controller 252, the memory 254, or another signal source. The EM drive signal generated by the transmitter 256 may include an EM pulse sequence applied to the antenna 260.

The receiver 258 can receive the EM detection signal from the antenna 260. The receiver 258 can provide the received EM detection signal to the controller 212, the memory 258, the communication interface 266, or to another device. The receiver 258 may also digitize or preprocess the EM detection signal from the antenna 260. The EM detection signal may be transmitted to the surface using the communication interface 266 and analyzed using the computing subsystem 110 of FIG. 1 to determine a property of the earth formation including but not limited to the type and quantity of fluid in the formation, the porosity of the formation, and the permeability of the formation.

The antenna 260 is electrically coupled to the transmitter 256 and receiver 258 and can receive an EM drive signal from the transmitter 256 to generate a magnetic field about the NMR logging tool 202. The magnetic field generated by the antenna 260 can be, for example, an EM pulse that manipulates the direction of polarization of nuclear spins in the region of interest about the wellbore. The antenna 260 can receive a current from the transmitter 256 and produce a magnetic dipole field based on the current. When collecting NMR data, the antenna 260 magnetically couples with the nuclear spins in the subterranean region, which induces an EM detection signal through the antenna. The antenna 260 can output the detection signal to the receiver 258.

The controller 252 controls operation of the logging tool 202. For example, the controller 252 can control the transmitter 256 and the receiver 258 to control pulse sequences applied to the antenna 260, and to control the detection of NMR signals by the antenna 260. The controller 252 can be, for example, a digital electronic controller, a programmable microprocessor, or any other type of data processing apparatus. The controller 252 generates an input signal for the transmitter 256 by calculating a transfer function for the transmitter 256 and the antenna 260 based at least in part on a measured parameter taken with the sensor 264 as further described herein. The controller 252 applies the input signal to the transmitter 256 to transmit an EM signal with the antenna 260.

The memory 254 can include any type of data storage, computer memory, or another type of computer-readable medium. The memory 254 can store machine-readable instructions that are executed by the controller 252 to operate the NMR logging tool 202. The memory 254 can store a pulse program that specifies one or more pulse sequences to be applied by the antenna 260. The memory 254 may also store NMR data acquired by the NMR logging tool 202. For example, the memory 254 may store NMR logging data obtained from a subterranean region. The memory 254 may store additional or different types of data.

The sensor 264 is a measurement device that measures a parameter indicative of a property of the transmitter, which is also indicative of the transfer function of the electrical system. The sensor 264 may include a temperature sensor or a device to measure the resistive and/or reactive components of the electrical system, including the transmitter 256 and the antenna 260. The resistive and/or reactive components may be used to calculate a quality factor based on the frequency of the signal applied to the electrical system.

The quality factor is a dimensionless parameter that indicates the damping or energy loss of the electrical system including the transmitter 256 and/or the antenna 260. The quality factor may be used to identify a transfer function for the electrical system. The quality factor may be a function of the reactive (inductive or capacitive) and/or resistive components of the transmitter 256 and/or antenna 260. The quality factor may also depend on the frequency of the EM signal applied to the electrical system including the transmitter 256 and/or antenna 260. The quality factor of the transmitter 256 and/or antenna 260 may also be a function of the temperature of the electrical components. For example, the sensor 264 may measure the temperature of the transmitter 256 and the antenna 260 to determine the quality factor of the electrical system, which in turn is used to generate the input signal to drive the antenna 260.

The communication interface 266 allows the NMR logging tool 202 to interface with other tools, systems, or communication links. The communication interface 266 may include a data port that allows pulse sequences to be loaded into the memory 254 or programmed into the controller 212. The communication interface 266 may also include a data port that allows NMR logging data to be communicated from the NMR logging tool 202 to an external computing system or database. The communication interface 266 may include a telemetry device that transmits NMR logging data from the NMR logging tool 202 while the NMR logging tool 202 is disposed within a wellbore in a subterranean formation. For example, the NMR logging data may be transmitted to a computing system or another destination at the surface.

As the transmitter 256 is deployed downhole during, for example a logging operation, the conditions in the wellbore may vary along the wellbore, which in turn may cause the EM signal emitted by the antenna 260 to undergo various distortions in amplitude, phase, or spectrum. The distortions can affect the pulse sequence transmitted through the earth formation using the transmitter 256. Distortions in the pulse sequence may also affect the logging data obtained from the NMR logging tool 202 creating inaccuracies in the formation properties determined from the logging data.

To mitigate the effects of distortions in the emitted EM signal and therefore alleviate any subsequent distortions exhibited in the logging data, the sensor 264 measures one or more parameters including but not limited to either one or both of a temperature and the quality factor of the electrical system comprising the transmitter 256 and/or the antenna 260. The sensor 264 may measure the parameters before transmitting the pulse sequence to calibrate the electrical system. The sensor 264 may also measure the parameters while the pulse sequence is being transmitted and correct the output signal of the transmitter 256. The controller 252 generates an input signal for the transmitter 256 based at least in part on the measured parameter as further described below. The generated input signal is applied to the transmitter 256 to drive the antenna 260 and transmit an EM signal with the effects of the distortion mitigated.

To correct the output signal of the transmitter 256 for distortions, the electrical system can be modeled in the time and frequency domains. Assuming the electrical system including the transmitter 256 and the antenna 260 is a linear system, the output signal of the antenna 260 can be expressed as a convolution in the time domain:

$$y(t)=x(t)*s(t) \quad (1)$$

where x(t) is the input signal applied by the controller 252 to the transmitter 256, y(t) is the output signal emitted from the antenna 260, and s(t) is the system transfer function or impulse response of the electrical system including the transmitter 256 and the antenna 260. In the frequency domain, the output signal can be expressed as:

$$Y(\omega)=X(\omega)S(\omega) \quad (2)$$

where $Y(\omega)$, $X(\omega)$, and $S(\omega)$ are the respective functions y(t), x(t), and s(t) in the frequency domain. As previously mentioned, the output signal y(t) may exhibit distortions and not match an expected output signal. To produce an output signal that matches the desired or expected output signal y'(t), the corresponding input signal x'(t) for the electrical system can be expressed in the frequency domain as:

$$X'(\omega)=Y'(w)/S(w) \quad (3)$$

where $X'(\omega)$ is the input signal generated by the controller 252 to mitigate distortions produced in the electrical system under various downhole conditions, and Y'(w) is the desired or expected output signal. By substituting the expression for the transfer function S(w) from Eq. (2), the expression for the input signal x'(t) becomes:

$$X'(\omega)=Y'(w)/Y(w)X(\omega) \quad (4)$$

If y'(t) is also assumed to represent the input signal x(t) of Eq. (4) that produced y(t), the expression for the input signal x'(t) in the frequency domain is given by:

$$X'(\omega)=Y'^{2}(w)/Y(w) \quad (5)$$

where Y'(w) is the desired or expected output signal, including but not limited to a Hann window, emitted from the antenna 260, and Y(w) is the measured output signal of the electrical system when the desired or expected output signal y'(t) is applied as the input signal x(t), for example in Eq. (2). Thus, the input signal x'(t) that mitigates distortions may be derived from the inverse Fourier transform of $Y'^{2}(w)/Y(w)$. Eq. (5) or x'(t) may be used to calibrate the transmitter 256 and antenna 260 under closed-loop applications when the output signal y(t) can be measured to produce a look-up table of parameter values (temperature and/or quality factor) associated with transfer functions of the electrical system.

To improve the output signal produced under open-loop applications and therefore mitigate the distortions that would be exhibited in the output signal, the transfer function $S(\omega)$ may also be used to generate the input signal $X'(\omega)$ based on Eq. (3). The system transfer function $S(\omega)$ is a function of the quality factor and/or temperature of the transmitter 256 and the antenna 260. The electrical system including the transmitter 256 and the antenna 260 may be subjected to multiple conditions where the quality factor and/or the temperature are different under the respective conditions. For example, the transmitter 256 and the antenna 260 may be subjected to different pressures and temperatures. The qualify factor and temperature of the electrical may be measured and recorded. The transfer function may be calculated for each of any one or combination of the quality factor and the temperature to produce a look-up table of values quality factor and/or temperature corresponding to transfer functions. During the wellbore logging process, a regression method, including linear or non-linear regression methods, may be applied to determine the transfer function from the table of values of the quality factor and/or temperature corresponding to transfer functions based on the measured quality factor or temperature from the sensor 264. The input signal may then be generated based on the system transfer function and the expected or desired output signal using the expression for the input signal in Eq. (3) to correct for any distortions exhibited by the output signal of the transmitter 256.

Figure 3:
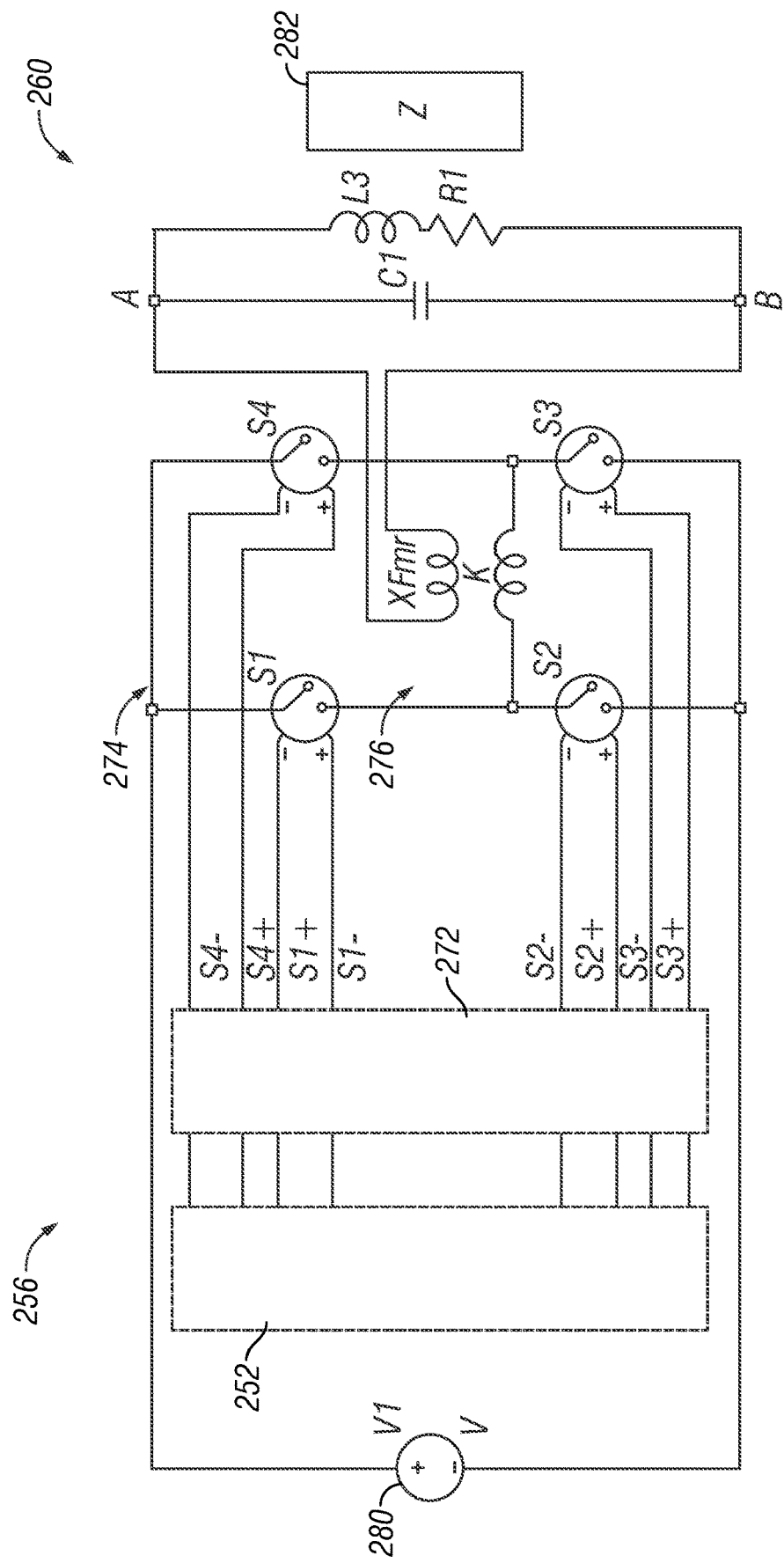
FIG. 3 shows a schematic view of a controller, transmitter, and antenna included in the NMR logging tool of FIG. 2, according to one or more embodiments.

FIG. 3 shows a schematic view of the controller 252, transmitter 256, and antenna 260 included in the NMR logging tool 202 of FIG. 2, in accordance with one or more embodiments. As shown, the transmitter 256 is electrically coupled to the controller 252, the antenna 260, and an electrical power supply 280. The antenna 260 is also in electrical communication with an electrical load 382, which includes but is not limited to the electrical impedance of the drilling fluid and subterranean earth formation. As discussed previously, the downhole conditions may vary during the logging process and affect the system transfer function for the electrical system comprising the transmitter 256, antenna 260, and the electrical load 282. Under open-loop applications, the input signal may be generated based at least in part on the measured parameter from the sensor 264 (FIG. 2) to mitigate the effects of the downhole conditions on the emitted EM signal and correct for any distortions exhibited by the output signal of the transmitter 256.

The transmitter 256 also includes a switch driver 272, an H-bridge 274, and a transformer 276. The H-bridge 274 is used to control the direction of current applied to the transformer 276 and antenna 260. The H-bridge 274 includes switches S1-S4, which may be solid-state switches, transistors, or relays to control the current applied to the transformer 276. The electrical power supply 280 is electrically coupled to the H-bridge 274 and used to drive the antenna 260 to emit an EM signal. The controller 252 applies the input signal to the switch driver 272, which converts the input signal into suitable input voltages for the switches S1-S4 The controller 252 may monitor measurements from the sensor 264 (FIG. 2) to determine the system transfer function and generate an input signal to mitigate distortions caused by the downhole conditions which allows for more accurate NMR logging data.

As examples of the output signals generated using the method and systems described herein, FIGS. 4A-7B shows graph views of the output signal generated by the logging tool 202 under various conditions, in accordance with one or more embodiments. In FIGS. 4A-7B, the measured output signal emitted from the logging tool 202 is compared to a Hann window, which was used as the expected or desired output signal. It should be appreciated that the expected or desired output signal is not limited to a Hann window, but may also include other suitable waveforms, such as a Hamming window, a Gaussian window, or sinusoidal waveform.

Figure 4A:
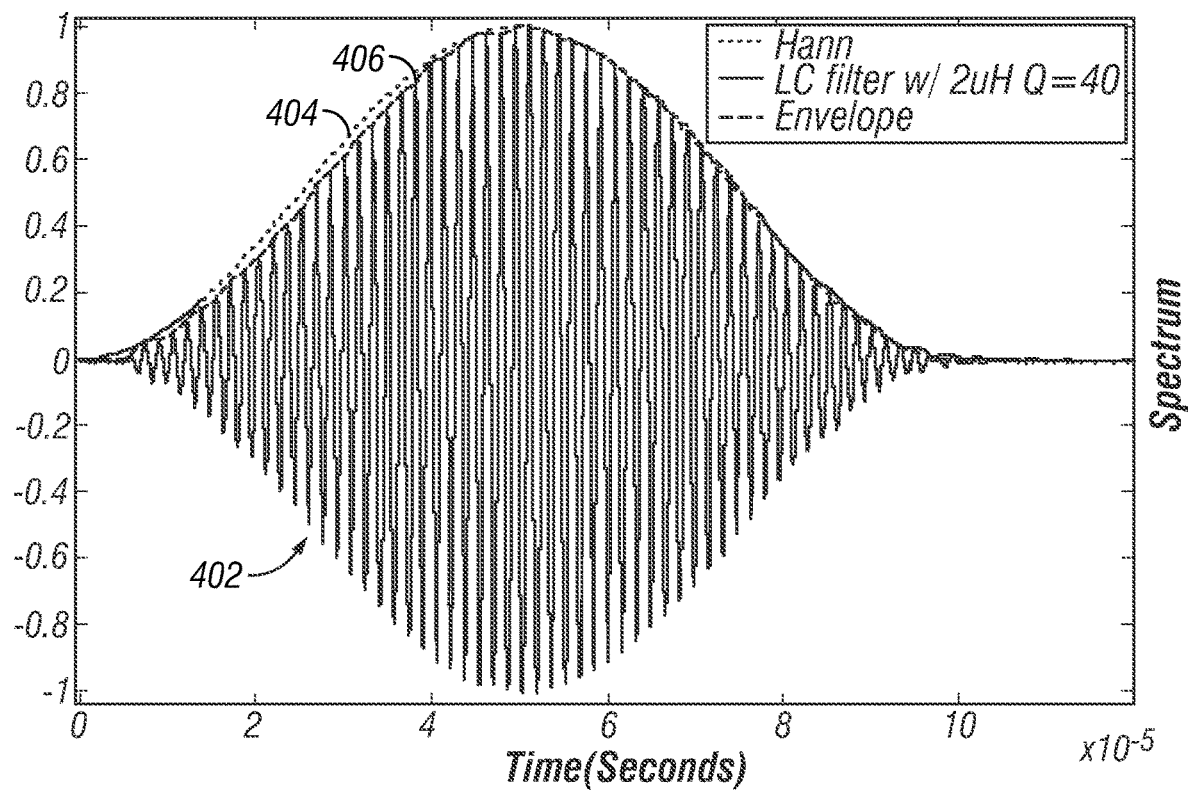
FIGS. 4A-7B show graph views of the output signal generated by the logging tool of FIG. 2 under various conditions, in accordance with one or more embodiments.
Figure 4B:
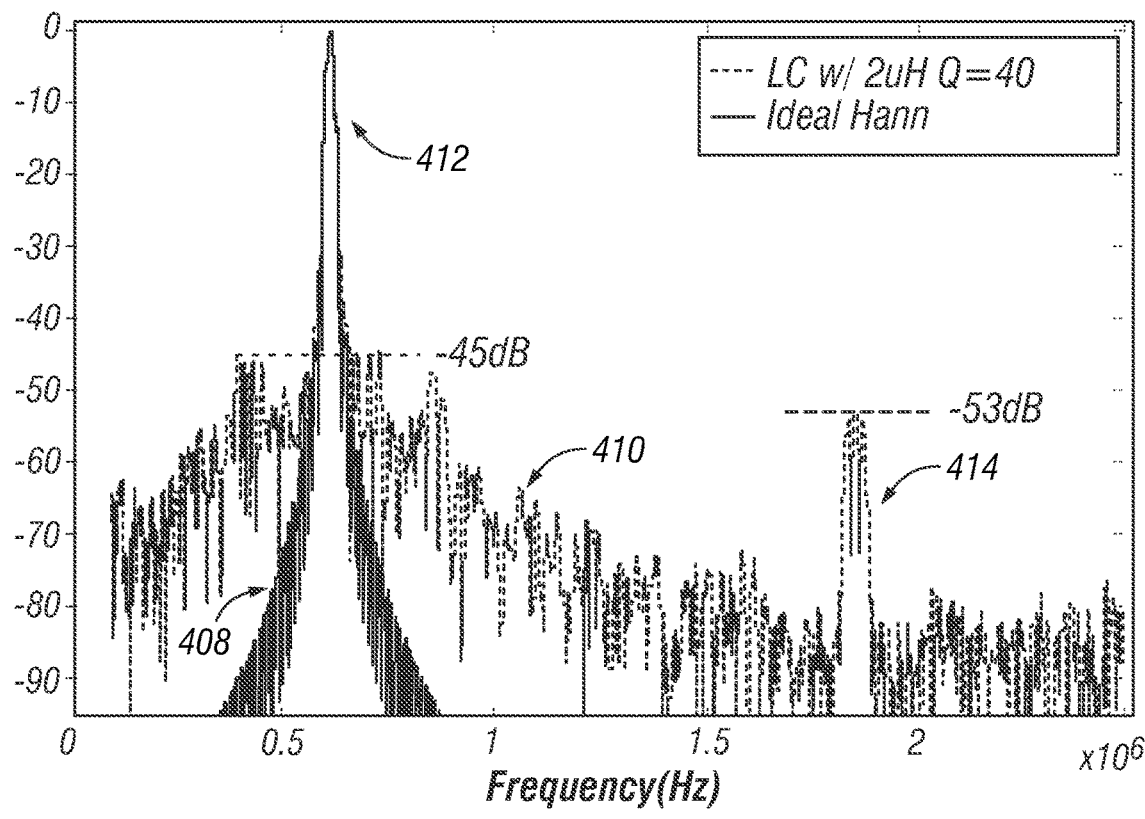

The output signal depicted in FIGS. 4A and 4B was recorded when the logging tool 202 was subjected to conditions that produced a quality factor (Q) of 40 and a resonant filter (LC) was connected to the transmitter. Similarly, the output signal depicted in FIGS. 5A and 5B was recorded when the logging tool 202 exhibited a quality of factor of 40 without a filter connected to the transmitter. FIGS. 6A and 6B show the output signal when the logging tool 202 exhibited a quality factor of 100 and a resonant filter (LC) was connected to the transmitter. Likewise, the output signal depicted in FIGS. 7A and 7B was recorded when the logging tool 202 exhibited a quality factor of 100 without a filter connected to the transmitter.

FIG. 4A shows the measured output signal 402 in the time domain with the curves 404 and 406 representing the Hann window and the envelope of the measured output signal, respectively. The curves 404 and 406 demonstrate that the envelope for the measured output signal closely matches the Hann window. FIG. 4B shows the measured output signal 410 and the Hann window 408 in the frequency domain. The measured output signal 410 has two spectral peaks 412 and 414, whereas the Hann window 408 has a single spectral peak which closely matches the spectral peak 412 of the measured output signal.

Figure 5A:
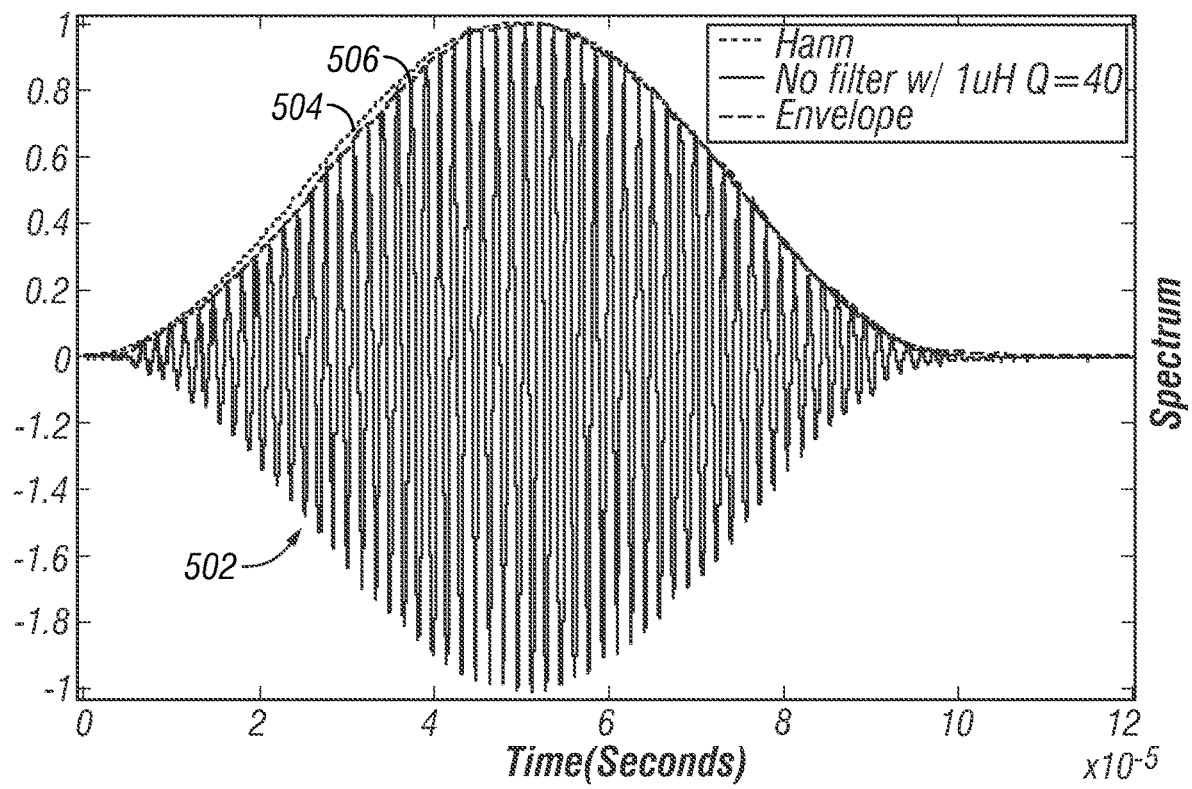
Figure 5B:
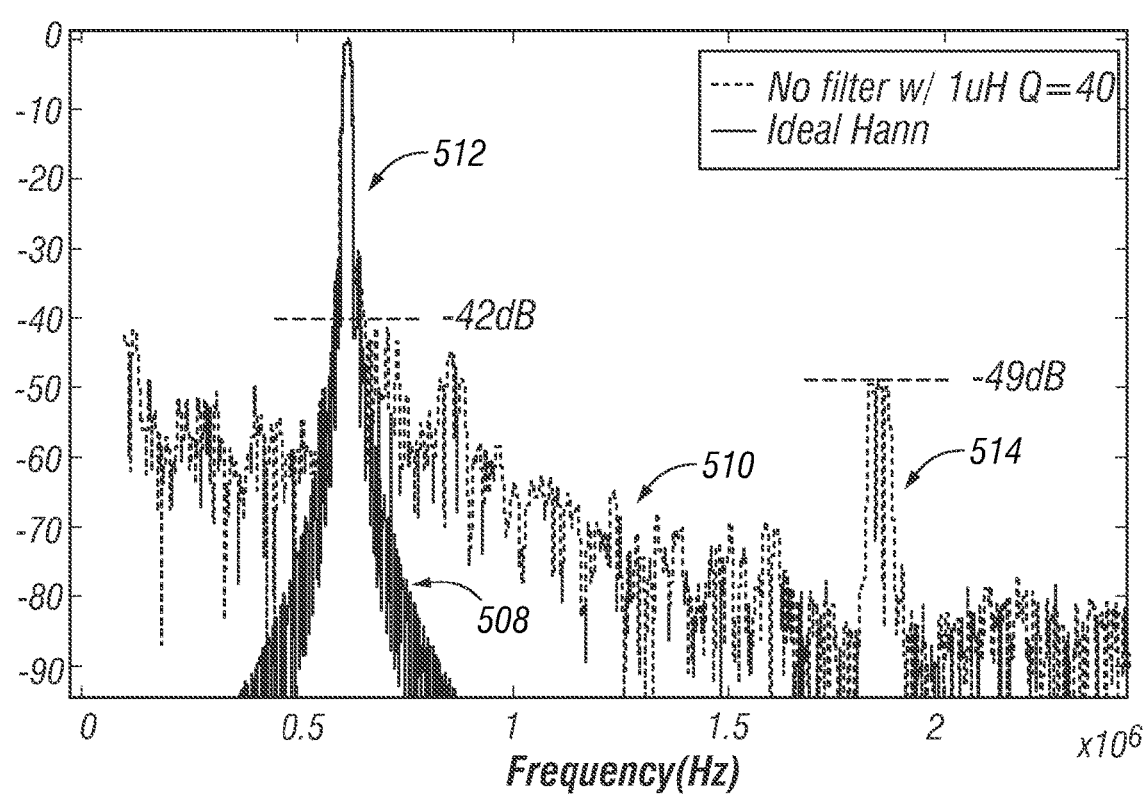
Figure 6A:
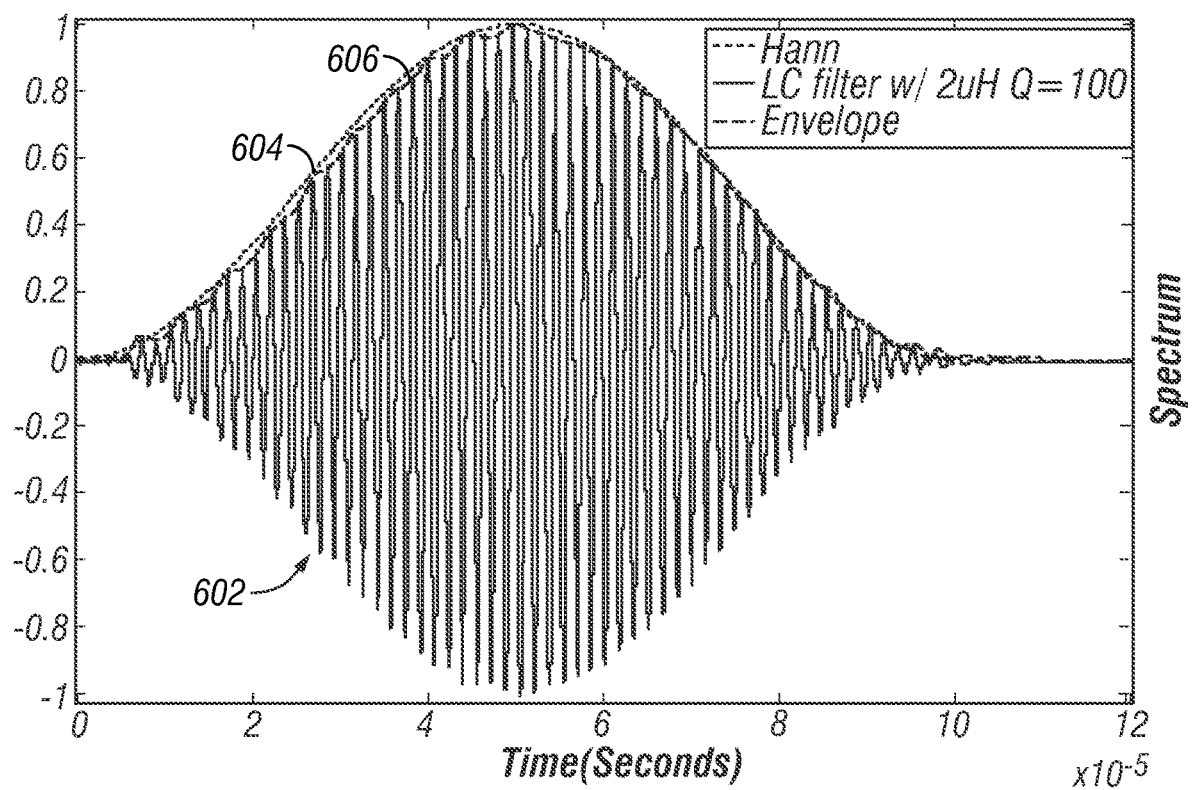
Figure 6B:
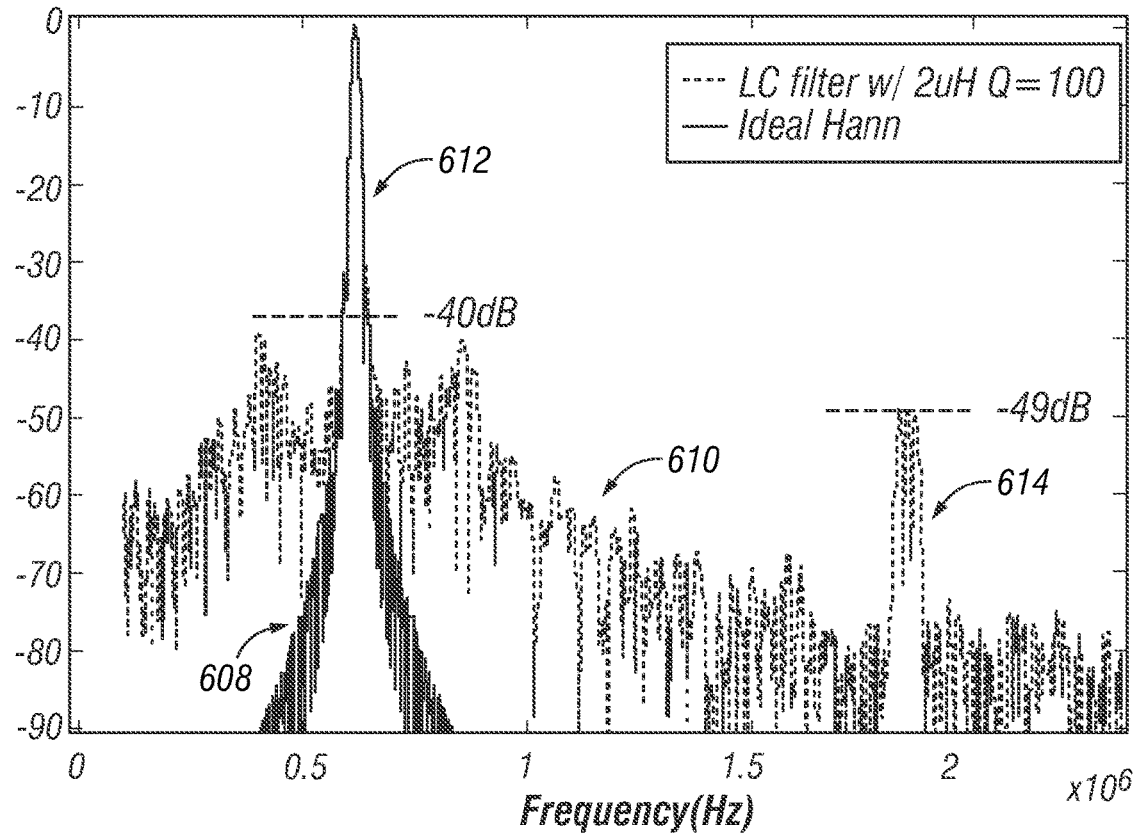
Figure 7A:
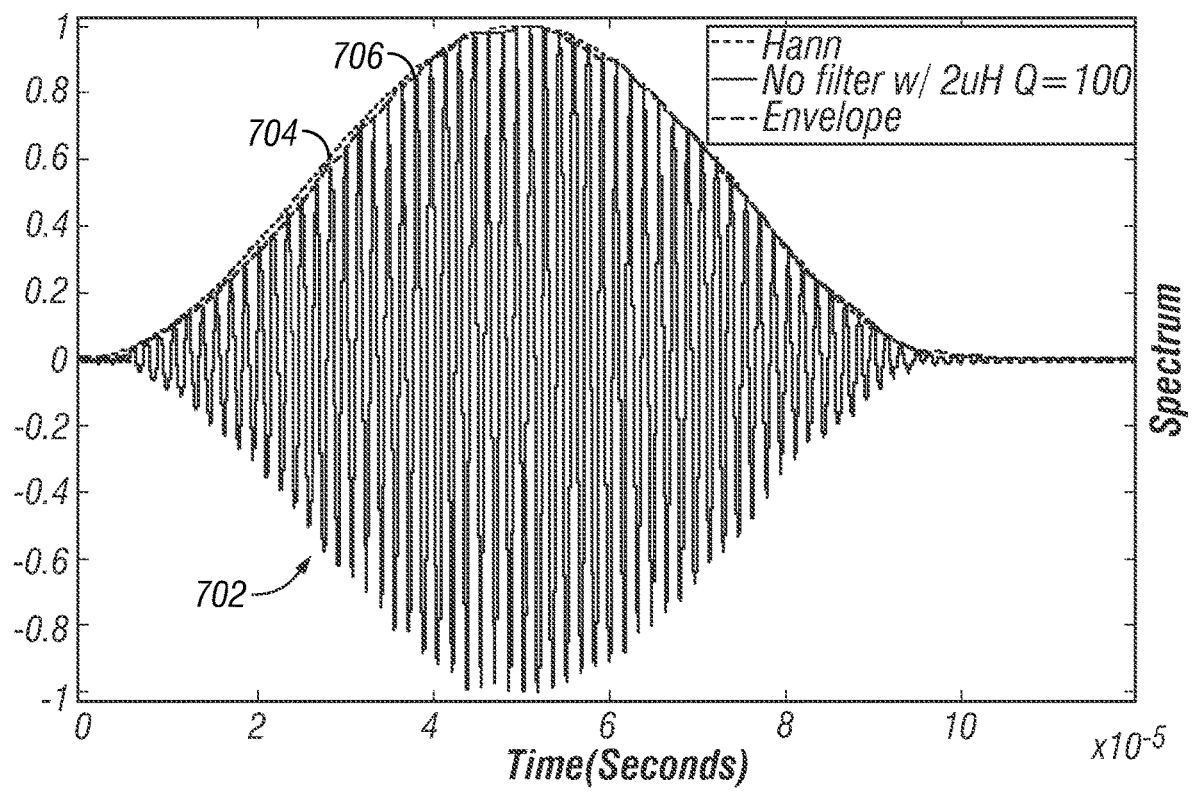
Figure 7B:
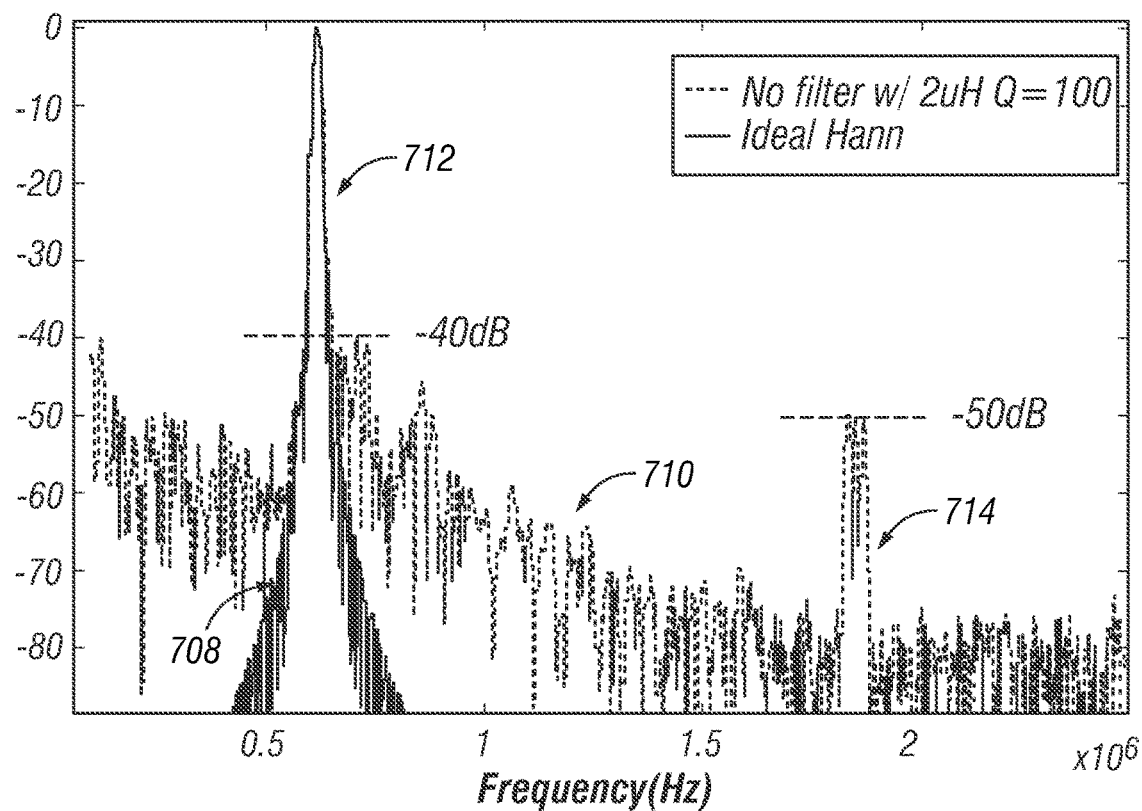

FIG. 5A shows the measured output signal 502 in the time domain with curves 504 and 506 representing the Hann window and the envelope of the measured output signal, respectively. The curves 504 and 506 also demonstrate that the envelope for the measured output signal closely matches the Hann window. FIG. 5B shows the measured output signal 510 and the Hann window 508 in the frequency domain. The measured output signal 510 again exhibits two spectral peaks 512 and 514, whereas the Hann window 508 has a single spectral peak. The spectral peak 512 also closely matches the spectral peak of the Hann window.

FIGS. 6A-7B also depict similar characteristics for the measured output signals 602, 610, 702, 710, relative to the Hann windows 604, 608, 704, 708, in the time and frequency domains. FIGS. 4A-7B demonstrate that although the envelopes of the measured output signal closely match the Hann window in the time domain, the spectral response of the measured output signal may exhibit some spectral harmonics or distortions relative to the Hann window. FIGS. 4A-7B also demonstrate that the input signal may be generated using the measured parameter to correct for distortions exhibited by the output signal.

Figure 8:
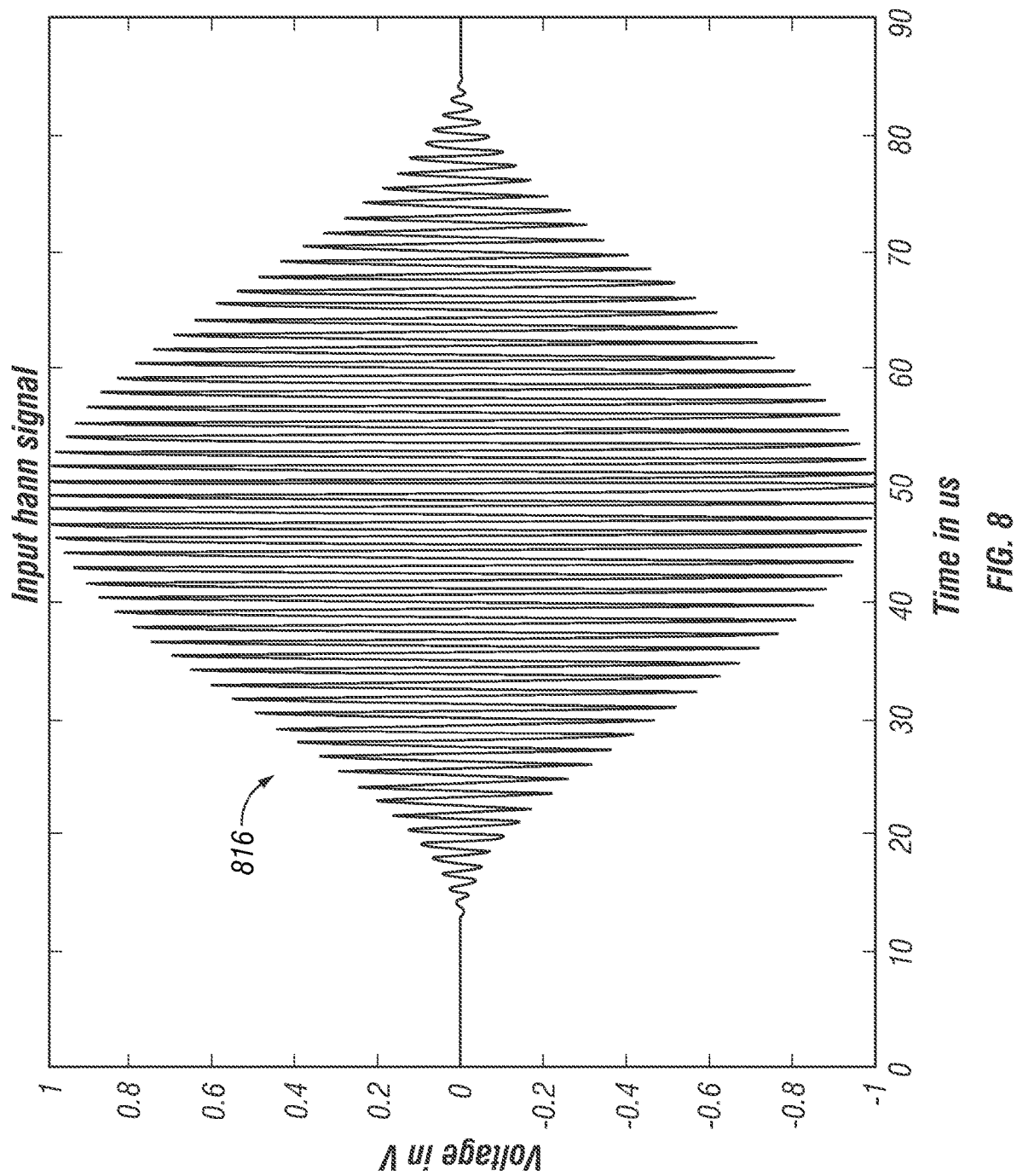
FIGS. 8 and 9 show graph views of the input signal generated to mitigate distortions and the output signal of the logging tool, respectively, in accordance with one or more embodiments.
Figure 9:
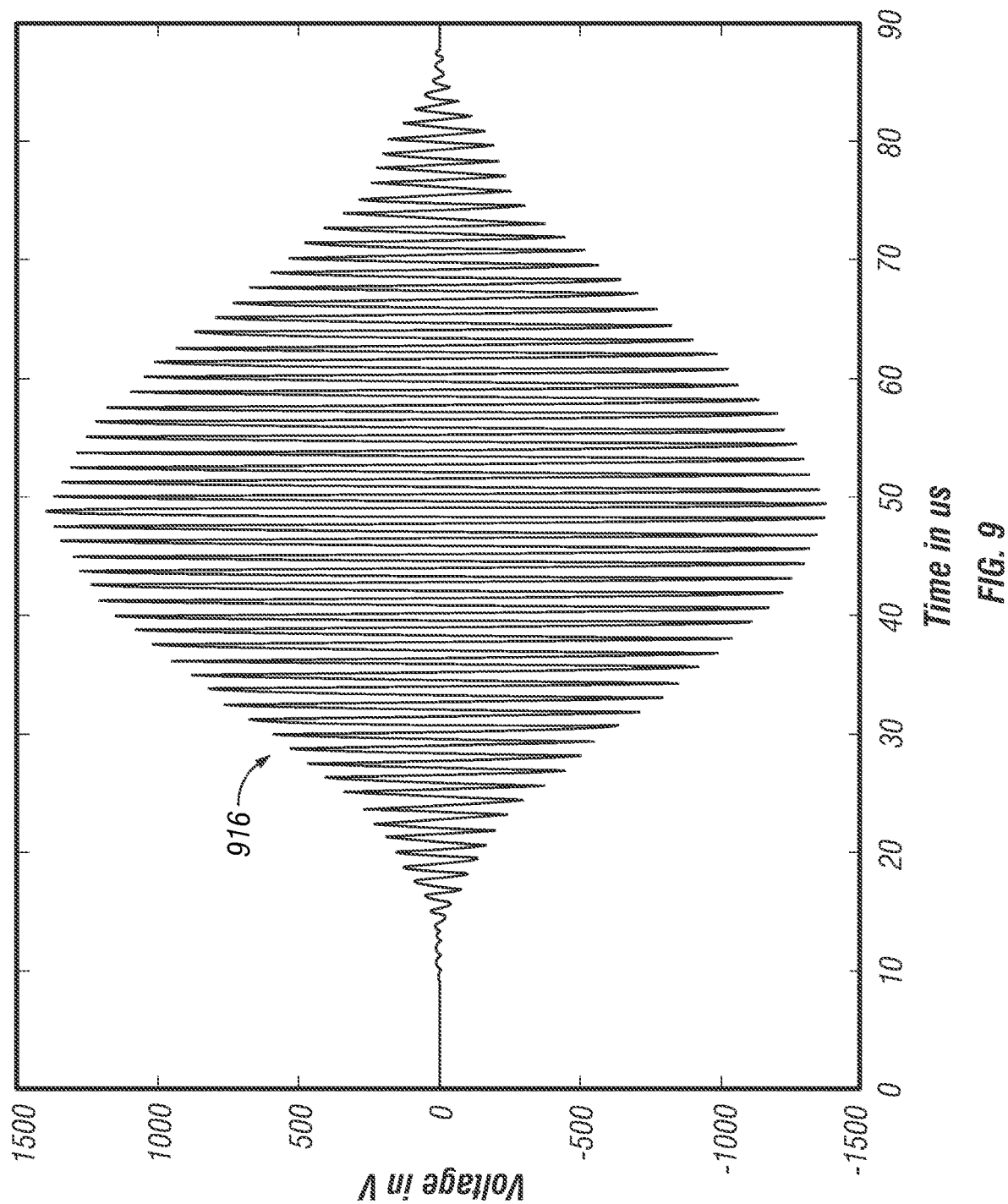

FIGS. 8 and 9 show graph views of the input signal 816 generated to mitigate distortions and the output signal 918 of the logging tool, respectively, in accordance with one or more embodiments. In FIGS. 8 and 9, the input signal 816 and the output signal 918 are depicted in the time domain, and the Hann window again is used as the expected or desired output signal. The input signal 816 was generated using the transfer function determined from the measured parameter to mitigate distortions that would be exhibited in the output signal. The envelope of the output signal 918 does not match the input signal, but would closely match the Hann window, as previously demonstrated in FIGS. 4A, 5A, 6A, and 7A.

The graphs shown in FIGS. 4A-7B, 8, and 9 demonstrate that the input signal may be generated for a transmitter based at least in part on a parameter measured using a sensor to correct for distortions that would be exhibited in the output signal. The measured parameter may be the temperature of the transmitter and/or the quality factor of the transmitter. In downhole applications, the measured parameter may be used to identify the transfer function of the electrical system in a look-up table of values of the parameter corresponding to transfer functions. As previously discussed, the transfer function $S(\omega)$ may be used to generate the input signal $X'(\omega)$ based on Eq. (3) to mitigate for distortions that would be exhibited in the output signal. Distortions in the pulse sequence of an NMR logging tool may affect the logging data obtained from the NMR logging tool, and thus, mitigating such distortions can provide more accurate logging data.

It should be appreciated that the system and methods described herein provide a solution necessarily rooted in downhole NMR logging tools in order to overcome a problem specifically arising from transmitting the RF pulse sequence, which may exhibit distortions due to changes in the downhole conditions including but not limited to pressure and temperature. The methods and system described herein provide an input signal that can be generated based on a measured parameter to mitigate the distortions that would be exhibited by the transmitter under such downhole conditions and provide more accurate logging data.

In addition to the embodiments described above, many examples of specific combinations are within the scope of the disclosure, some of which are detailed below:

Example 1: A method of transmitting an electromagnetic (EM) signal in a wellbore through an earth formation, comprising:

measuring a parameter indicative of a property of a transmitter using a sensor in the wellbore;

generating an input signal for the transmitter based at least in part on the measured parameter to correct distortions exhibited by the output signal of the transmitter; and applying the input signal to the transmitter to transmit the EM signal corrected for distortions.

Example 2: The method of example 1, wherein the parameter comprises any one or combination of a temperature of the transmitter and a quality factor of the transmitter.

Example 3: The method of example 1, wherein generating the input signal comprises calculating a transfer function for the transmitter based at least in part on the measured parameter.

Example 4: The method of example 1, wherein generating the input signal comprises calculating the input signal based on the inverse Fourier transform of the expression:

$$Y'(w)/S(w)$$

wherein Y'(w) is an output signal of the transmitter in the frequency domain, and S(w) is the transfer function of the transmitter in the frequency domain.

Example 5: The method of example 1, further comprising:
subjecting the transmitter to sets of conditions, wherein the value of the parameter is different under each respective set of conditions; and
calculating transfer functions of the transmitter for the different values of the parameter.

Example 6: The method of example 1, wherein generating the input signal comprises identifying a transfer function for the transmitter based at least in part on a table of values of the parameter, each value of the parameter corresponding to a different transfer function.

Example 7: The method of example 1, further comprising transmitting an EM pulse sequence for nuclear magnetic resonance measurements based on the input signal.

Example 8: The method of example 1, further comprising transmitting the EM signal to measure an additional parameter of the earth formation.

Example 9: The method of example 1, further comprising positioning the transmitter, the sensor, and the antenna in the wellbore.

Example 10: A system for transmitting an electromagnetic (EM) signal in a wellbore, comprising:
an antenna;
a transmitter electrically coupled to the antenna;
a sensor operable to measure a parameter indicative of a property of the transmitter and locatable in the wellbore; and
a controller configured and operable to:
generate an input signal for the transmitter based at least in part on the measured parameter to correct distortions exhibited by an output signal of the transmitter; and
apply the input signal to the transmitter to transmit the EM signal corrected for the distortions.

Example 12: The system of example 10, wherein the parameter comprises any one or combination of a temperature of the transmitter and a quality factor of the transmitter.

Example 13: The system of example 10, wherein the controller is further operable to calculate a transfer function for the transmitter based at least in part on the measured parameter.

Example 14: The system of example 10, wherein the processor is further operable to calculate the input signal based on the inverse Fourier transform of the expression:

$$Y'(w)/S(w)$$

wherein Y'(w) is an output signal of the transmitter in the frequency domain, and S(w) is the transfer function of the transmitter in the frequency domain.

Example 15: The system of example 10, wherein the controller is further operable to identify a transfer function for the transmitter based at least in part on a table of values of the parameter and transfer functions, each value of the parameter corresponding to a different transfer function.

Example 16: A nuclear magnetic resonance (NMR) logging tool for use in a wellbore, comprising:
a magnet system operable to produce a static magnetic field;
an antenna;
a transmitter electrically coupled to the antenna and operable to transmit an EM pulse sequence;
a sensor operable to measure a parameter indicative of a property of the transmitter and locatable in the wellbore; and
a controller configured and operable to:
generate an input signal for the transmitter based at least in part on the measured parameter to correct distortions exhibited by an output signal of the transmitter; and
apply the input signal to the transmitter to transmit the EM pulse sequence corrected for the distortions.

Example 17: The logging tool of example 16, wherein the parameter comprises any one or combination of a temperature of the transmitter and a quality factor of the transmitter Example 18: The logging tool of example 16, wherein the controller is further operable to calculate a transfer function for the transmitter based at least in part on the measured parameter.

Example 19: The logging tool of example 16, wherein the controller is further operable to calculate the input signal based on the inverse Fourier transform of the expression:

$$Y'(w)/S(w)$$

wherein Y'(w) is an output signal of the transmitter in the frequency domain, and S(w) is the transfer function of the transmitter in the frequency domain.

Example 20: The logging tool of example 16, wherein the controller is further operable to identify a transfer function for the transmitter based at least in part on a table of values of the parameter, each value of the parameter corresponding to a different transfer function.

This discussion is directed to various embodiments of the present disclosure. The drawing figures are not necessarily to scale. Certain features of the embodiments may be shown exaggerated in scale or in somewhat schematic form and some details of conventional elements may not be shown in the interest of clarity and conciseness. Although one or more of these embodiments may be preferred, the embodiments disclosed should not be interpreted, or otherwise used, as limiting the scope of the disclosure, including the claims. It is to be fully recognized that the different teachings of the embodiments discussed may be employed separately or in any suitable combination to produce desired results. In addition, one skilled in the art will understand that the description has broad application, and the discussion of any embodiment is meant only to be exemplary of that embodiment, and not intended to suggest that the scope of the disclosure, including the claims, is limited to that embodiment.

Certain terms are used throughout the description and claims to refer to particular features or components. As one skilled in the art will appreciate, different persons may refer to the same feature or component by different names. This document does not intend to distinguish between components or features that differ in name but not function, unless specifically stated. In the discussion and in the claims, the terms "including" and "comprising" are used in an open-ended fashion, and thus should be interpreted to mean "including, but not limited to . . . ." Also, the term "couple" or "couples" is intended to mean either an indirect or direct connection. In addition, the terms "axial" and "axially" generally mean along or parallel to a central axis (e.g., central axis of a body or a port), while the terms "radial" and "radially" generally mean perpendicular to the central axis. The use of "top," "bottom," "above," "below," and variations of these terms is made for convenience, but does not require any particular orientation of the components.

Reference throughout this specification to "one embodiment," "an embodiment," or similar language means that a particular feature, structure, or characteristic described in connection with the embodiment may be included in at least one embodiment of the present disclosure. Thus, appearances of the phrases "in one embodiment," "in an embodiment," and similar language throughout this specification may, but do not necessarily, all refer to the same embodiment.

Although the present disclosure has been described with respect to specific details, it is not intended that such details should be regarded as limitations on the scope of the disclosure, except to the extent that they are included in the accompanying claims.

What is claimed is:

1. A method of transmitting an electromagnetic (EM) signal in a wellbore through an earth formation, comprising:
    measuring a parameter indicative of a property of a transmitter using a sensor in the wellbore;
    generating an input signal for the transmitter based at least in part on the measured parameter to correct distortions exhibited by the output signal of the transmitter; and
    applying the input signal to the transmitter to transmit the EM signal corrected for distortions.

2. The method of claim 1, wherein the parameter comprises any one or combination of a temperature of the transmitter and a quality factor of the transmitter.

3. The method of claim 1, wherein generating the input signal comprises calculating a transfer function for the transmitter based at least in part on the measured parameter.

4. The method of claim 1, wherein generating the input signal comprises calculating the input signal based on the inverse Fourier transform of the expression:

$$Y'(w)/S(w)$$

wherein Y'(w) is an output signal of the transmitter in the frequency domain, and S(w) is the transfer function of the transmitter in the frequency domain.

5. The method of claim 1, further comprising:
    subjecting the transmitter to sets of conditions, wherein the value of the parameter is different under each respective set of conditions; and
    calculating transfer functions of the transmitter for the different values of the parameter.

6. The method of claim 1, wherein generating the input signal comprises identifying a transfer function for the transmitter based at least in part on a table of values of the parameter, each value of the parameter corresponding to a different transfer function.

7. The method of claim 1, further comprising transmitting an EM pulse sequence for nuclear magnetic resonance measurements based on the input signal.

8. The method of claim 1, further comprising transmitting the EM signal to measure an additional parameter of the earth formation.

9. The method of claim 1, further comprising positioning the transmitter, the sensor, and the antenna in the wellbore.

10. A system for transmitting an electromagnetic (EM) signal in a wellbore, comprising:
    an antenna;
    a transmitter electrically coupled to the antenna;
    a sensor operable to measure a parameter indicative of a property of the transmitter and locatable in the wellbore; and
    a controller configured and operable to:
        generate an input signal for the transmitter based at least in part on the measured parameter to correct distortions exhibited by an output signal of the transmitter; and
        apply the input signal to the transmitter to transmit the EM signal corrected for the distortions.

11. The system of claim 10, wherein the parameter comprises any one or combination of a temperature of the transmitter and a quality factor of the transmitter.

12. The system of claim 10, wherein the controller is further operable to calculate a transfer function for the transmitter based at least in part on the measured parameter.

13. The system of claim 10, wherein the processor is further operable to calculate the input signal based on the inverse Fourier transform of the expression:

$$Y'(w)/S(w)$$

wherein Y'(w) is an output signal of the transmitter in the frequency domain, and S(w) is the transfer function of the transmitter in the frequency domain.

14. The system of claim 10, wherein the controller is further operable to identify a transfer function for the transmitter based at least in part on a table of values of the parameter and transfer functions, each value of the parameter corresponding to a different transfer function.

15. The system of claim 10, wherein the controller is further operable to calculate transfer functions of the transmitter for different values of the parameter, wherein the values of the parameter are dependent on different conditions to which the transmitter is subjected.

16. A nuclear magnetic resonance (NMR) logging tool for use in a wellbore, comprising:
    a magnet system operable to produce a static magnetic field;
    an antenna;
    a transmitter electrically coupled to the antenna and operable to transmit an EM pulse sequence;
    a sensor operable to measure a parameter indicative of a property of the transmitter and locatable in the wellbore; and
    a controller configured and operable to:
        generate an input signal for the transmitter based at least in part on the measured parameter to correct distortions exhibited by an output signal of the transmitter; and
        apply the input signal to the transmitter to transmit the EM pulse sequence corrected for the distortions.

17. The logging tool of claim 16, wherein the parameter comprises any one or combination of a temperature of the transmitter and a quality factor of the transmitter.

18. The logging tool of claim 16, wherein the controller is further operable to calculate a transfer function for the transmitter based at least in part on the measured parameter.

19. The logging tool of claim 16, wherein the controller is further operable to calculate the input signal based on the inverse Fourier transform of the expression:

$$Y'(w)/S(w)$$

wherein Y'(w) is an output signal of the transmitter in the frequency domain, and S(w) is the transfer function of the transmitter in the frequency domain.

20. The logging tool of claim 16, wherein the controller is further operable to identify a transfer function for the transmitter based at least in part on a table of values of the parameter, each value of the parameter corresponding to a different transfer function.

\* \* \* \* \*